United States Patent
Gong et al.

(10) Patent No.: US 11,133,128 B2
(45) Date of Patent: Sep. 28, 2021

(54) SYSTEM IN PACKAGE MODULE ASSEMBLY, SYSTEM IN PACKAGE MODULE, AND ELECTRONIC DEVICE

(71) Applicant: Huawei Technologies Co., Ltd., Shenzhen (CN)

(72) Inventors: Yuping Gong, Shanghai (CN); Zhaozheng Hou, Shenzhen (CN); Junhe Wang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 731 days.

(21) Appl. No.: 16/022,055

(22) Filed: Jun. 28, 2018

(65) Prior Publication Data
US 2018/0308616 A1   Oct. 25, 2018

Related U.S. Application Data

(63) Continuation of application No. PCT/CN2016/111735, filed on Dec. 23, 2016.

(30) Foreign Application Priority Data

Dec. 28, 2015   (CN) .......................... 201510998716.X (51) Int. Cl.
*H01F 27/24*   (2006.01)
*H01L 23/50*   (2006.01)
(Continued)

(52) U.S. Cl.
CPC .............. *H01F 27/24* (2013.01); *H01F 3/14* (2013.01); *H01F 17/04* (2013.01); *H01F 27/027* (2013.01);
(Continued)

(58) Field of Classification Search
CPC .......... H01F 27/24; H01F 3/14; H01F 27/306; H01F 17/04; H01F 27/027;
(Continued)

(56) References Cited

U.S. PATENT DOCUMENTS

| 2011/0182039 A1 | 7/2011 | Kato et al. |
| 2011/0212577 A1 | 9/2011 | Hebert |

(Continued)

FOREIGN PATENT DOCUMENTS

| CN | 101383340 A | 3/2009 |
| CN | 101483381 A | 7/2009 |

(Continued)

*Primary Examiner* — Tszfung J Chan
(74) *Attorney, Agent, or Firm* — Leydig, Voit & Mayer, Ltd.

(57) ABSTRACT

A system in package module assembly is provided, and includes: a substrate, and a chip, an inductor, and an electrical element that are electrically connected to the substrate. The substrate includes a first surface, a second surface opposite to the first surface, and an accommodation groove. The accommodation groove passes through the second surface and the first surface. The inductor includes a magnetic core and an inductive coil. The magnetic core includes a base and a protrusion disposed on an outer surface of the base. The outer surface on which the protrusion is disposed and that is of the base abuts on the second surface. The protrusion is accommodated in the accommodation groove. The inductive coil is disposed in the protrusion. A system in package module and an electronic device are further provided.

10 Claims, 4 Drawing Sheets

(51) Int. Cl.
*H01F 27/02* (2006.01)
*H01F 17/04* (2006.01)
*H01L 25/00* (2006.01)
*H01F 3/14* (2006.01)
*H01F 27/30* (2006.01)
*H01L 23/492* (2006.01)
*H01L 23/498* (2006.01)

(52) U.S. Cl.
CPC ......... *H01F 27/306* (2013.01); *H01L 23/492* (2013.01); *H01L 23/50* (2013.01); *H01L 25/00* (2013.01); *H01F 2017/048* (2013.01); *H01L 23/49822* (2013.01); *H01L 2224/16225* (2013.01); *H01L 2924/15311* (2013.01); *H01L 2924/18161* (2013.01)

(58) Field of Classification Search
CPC ............. H01F 17/0013; H01F 17/0006; H01F 27/2804; H01F 2027/2809; H01F 5/003; H01F 27/292; H01F 17/0033; H01F 2017/0066; H01L 23/492
USPC .................................. 336/200, 232; 257/531
See application file for complete search history.

(56) References Cited

U.S. PATENT DOCUMENTS

| | | | |
|---|---|---|---|
| 2011/0317387 A1 | 12/2011 | Pan et al. | |
| 2012/0146181 A1 | 6/2012 | Lin et al. | |
| 2012/0212919 A1* | 8/2012 | Mano | H05K 3/4602 361/782 |
| 2013/0342301 A1* | 12/2013 | Mano | H01F 27/24 336/200 |
| 2014/0225700 A1 | 8/2014 | Doyle et al. | |
| 2015/0137932 A1 | 5/2015 | Chen et al. | |
| 2015/0173197 A1* | 6/2015 | Cho | H01F 41/046 361/748 |
| 2016/0284462 A1* | 9/2016 | Ahn | H01F 27/06 |
| 2018/0182532 A1* | 6/2018 | Stahr | H01F 27/2847 |

FOREIGN PATENT DOCUMENTS

| | | |
|---|---|---|
| CN | 102804934 A | 11/2012 |
| CN | 104160513 A | 11/2014 |

* cited by examiner

SYSTEM IN PACKAGE MODULE ASSEMBLY, SYSTEM IN PACKAGE MODULE, AND ELECTRONIC DEVICE

CROSS-REFERENCE TO RELATED APPLICATIONS

This application is a continuation of International Application No. PCT/CN2016/111735, filed on Dec. 23, 2016, which claims priority to Chinese Patent Application No. 201510998716.X, filed on Dec. 28, 2015. The disclosures of the aforementioned applications are hereby incorporated by reference in their entireties.

TECHNICAL FIELD

Embodiments of the present invention relate to the field of electronic component package technologies, and in particular, to a system in package module assembly, a system in package module, and an electronic device.

BACKGROUND

As the market of a portable consumer electronic product rapidly grows, how to improve performance of a portable product in terms of thinness, compactness, and low power consumption becomes an important topic for a system manufacturer. A system in package module SiP (Module System in Package) that is characterized by a small size and low power consumption is considered as a solution that is most suitable to be applied to the portable product.

In the system in package module, a line and a large quantity of electronic components such as a chip and a resistor are covered in an extremely small package, and this brings the following biggest advantage: Space can be saved and power consumption is low. Wireless communications modules that include WLAN, Bluetooth, GPS, WiMAX, and DVB-H/T-DMB modules may be imported into an electronic device by using the system in package module. Electronic components such as an integrated control chip, a resistor, and an inductor of an existing system in package module are disposed on a surface of a substrate, and the inductor is disposed above the chip. As a result, thickness of a system in package result is relatively large, and does not meet a thin feature emphasized for the portable product.

SUMMARY

The present invention provides a system in package module assembly, so that space of the system in package module assembly in entire thickness can be reduced, and an electronic product is thinned.

A first aspect of the present invention provides a system in package module assembly, where the system in package module assembly includes: a substrate, and a chip, an inductor, and an electrical element that are electrically connected to the substrate; the substrate includes a first surface, a second surface opposite to the first surface, and an accommodation groove; the accommodation groove passes through the second surface and the first surface; the inductor includes a magnetic core and an inductive coil disposed in the magnetic core; the magnetic core includes a base and a protrusion disposed on an outer surface of the base; the outer surface on which the protrusion is disposed and that is of the base abuts on the second surface; the protrusion is accommodated in the accommodation groove; the chip includes an installation surface; the chip is installed over the first surface and the installation surface is separated from and opposite to the first surface; the protrusion in the accommodation groove is exactly projected on the installation surface of the chip; and the electrical element is located around the chip.

With reference to the first aspect, in a first possible implementation of the first aspect, the Inductive coil includes a connection segment extending from the magnetic core, first pads are disposed on the second surface, and the connection segment is welded to the first pad.

With reference to the first possible implementation, in a second possible implementation, second pads are disposed on the first surface, the chip is welded to the second pad by using a welding body, and there is a gap between the chip and the first surface, to facilitate heat dissipation of the magnetic core.

With reference to the first aspect, or the first or the second possible implementation, in a third possible implementation, the inductive coil is disposed in the protrusion of the magnetic core; or one part of the inductive coil is disposed in the protrusion of the magnetic core, and the other part is disposed in the base of the magnetic core.

A second aspect of the present invention provides a system in package module, where the system in package module includes the system in package module assembly according to any one of the first aspect or the possible implementations of the first aspect and a plastic package body, and the plastic package body is formed on the first surface, and covers the first surface, the chip, the electrical element, and the accommodation groove. The plastic package body can prevent the chip and the electrical element from being damaged.

With reference to the second aspect, in a first possible implementation of the second aspect, a window is disposed at a position that is on the plastic package body and that is corresponding to the chip, and is configured to expose the chip, to effectively dissipate heat of the chip.

With reference to the second aspect, in a second possible implementation of the second aspect, the system in package module further includes a heat dissipation cover, the heat dissipation cover is disposed in the plastic package body, the heat dissipation cover covers the first surface and space is formed between the heat dissipation cover and the first surface, and the chip and the electrical element are accommodated in the space.

With reference to the second possible implementation, in a third possible implementation, a window is disposed on a surface that is of the plastic package body and that is opposite to the second surface, and the window is configured to expose a part that is of the heat dissipation cover and that is opposite to the first surface.

With reference to any one of the second aspect, or any one of the first to the third possible implementations of the second aspect, in a fourth possible implementation, a conducting ball electrically connected to the substrate is further disposed on the second surface, and a height of a part that is of the conducting ball and protrudes from the second surface is greater than thickness of the base of the magnetic core.

A third aspect of the present invention provides an electronic device, where the electronic device includes a circuit board and the system in package module according to any one of the possible implementations of the second aspect, and the second surface of the substrate faces the circuit board, and is welded and conducted to the circuit board.

According to the system in package module assembly described in the present invention, the inductive coil of the inductor is disposed in the substrate, so that space of the substrate in a thickness direction is saved, and thickness of the system in package module assembly is reduced. Therefore, space of the electronic device in thickness is saved, and a purpose of thinning the electronic device is achieved.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

To make the invention objectives, features, and advantages of the present invention clearer and more comprehensible, the following clearly and completely describes the technical solutions in the embodiments of the present invention with reference to the accompanying drawings in the embodiments of the present invention. Apparently, the embodiments described in the following are merely some rather than all of the embodiments of the present invention. All other embodiments obtained by a person of ordinary skill in the art based on the embodiments of the present invention without creative efforts shall fall within the protection scope of the present invention.

In the specification, claims, and accompanying drawings of the present invention, the terms "first", "second", "third", "fourth", and the like (if existent) are intended to distinguish between similar objects but do not necessarily indicate a specific sequence. It should be understood that the data termed in such a way is interchangeable in proper circumstances so that the embodiments of the present invention described herein can be implemented in other sequences than the sequence illustrated or described herein. Moreover, the terms "include", "contain" and any other variants mean to cover the non-exclusive inclusion, for example, a process, method, system, product, or device that includes a list of steps or units is not necessarily limited to those steps or units, but may include other steps, or units not expressly listed or inherent to such a process, method, system, product, or device.

The following separately provides detailed descriptions with reference to the specific embodiments.

Figure 1:
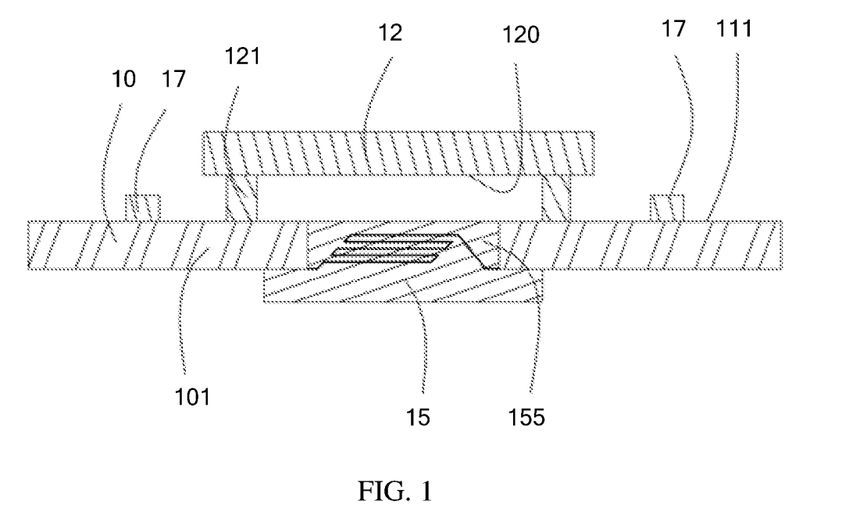
FIG. 1 is a schematic diagram of a cross section of a system in package module assembly according to the present invention, where a cut position of the cross section is a center position of an inductor of the system in package module assembly.
Figure 2:
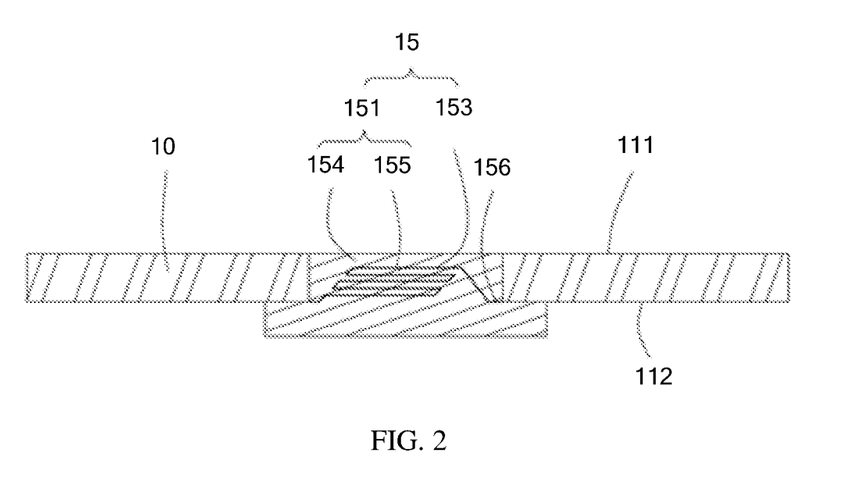
FIG. 2 is a schematic diagram of a cross section obtained after a chip is removed from the system in package module assembly shown in FIG. 1.
Figure 3:
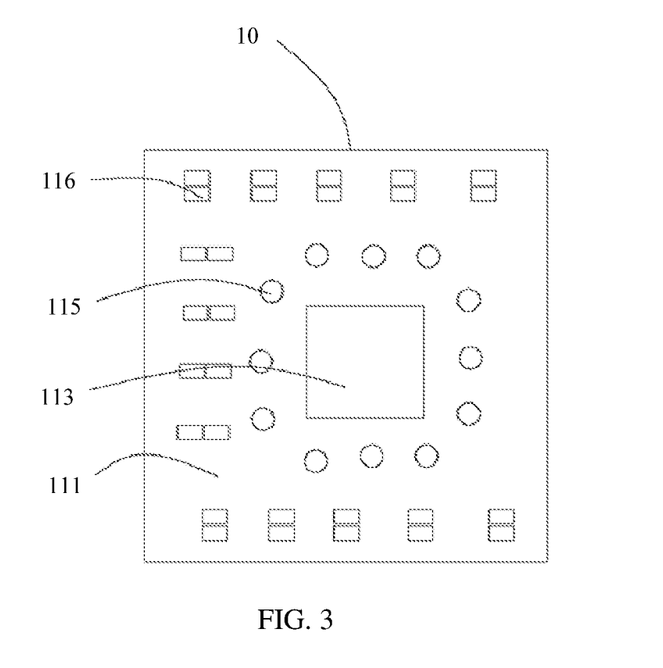
FIG. 3 and FIG. 4 are top views of the system in package module assembly shown in FIG. 1 from two different angles.

Referring to FIG. 1, FIG. 2, and FIG. 3, the present invention provides a system in package module assembly. The system in package module assembly includes a substrate 10, and a chip 12, an inductor 15, and an electrical element 17 that are electrically connected to the substrate 10. The substrate 10 includes a first surface 111, a second surface 112 opposite to the first surface 111, and an accommodation groove 113. The accommodation groove 113 passes through the second surface 112 and the first surface 111. The inductor 15 includes a magnetic core 151 and an inductive coil 153 disposed in the magnetic core 151. The magnetic core 151 includes a base 154 and a protrusion 155 disposed on an outer surface of the base 154. The outer surface on which the protrusion is disposed and that is of the base 154 abuts on the second surface 112 and covers the accommodation groove 113. The protrusion 155 is accommodated in the accommodation groove 113. The chip 12 includes an installation surface 120. The chip 12 is installed over the first surface 111 and the installation surface 120 is separated from and opposite to the first surface 111. The protrusion 155 in the accommodation groove 113 is exactly projected on the installation surface 120 of the chip 12. The electrical element 17 is located around the chip 12.

Further, the inductive coil 153 is disposed in the protrusion 155 of the magnetic core 151; or one part of the inductive coil 153 is disposed in the protrusion 155 of the magnetic core 151, and the other part is disposed in the base 154 of the magnetic core 151. In this embodiment, the inductive coil 153 is disposed in the protrusion 155.

Figure 4:
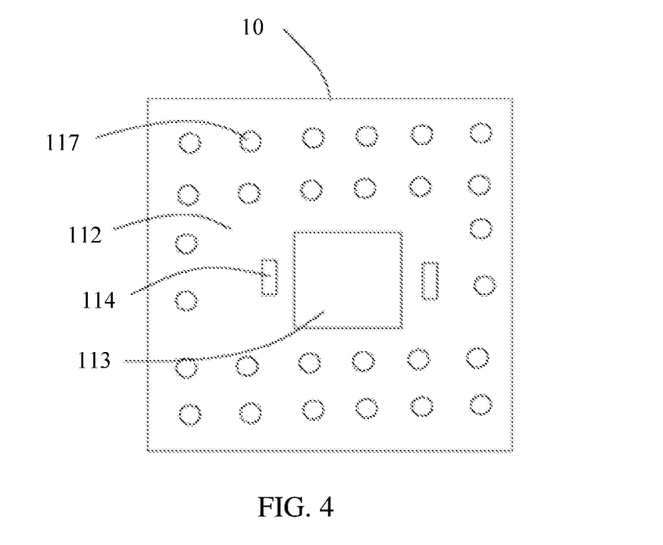

Referring to FIG. 4, in this embodiment, the substrate 10 is a rectangular board, the accommodation groove 113 is a through groove, and the accommodation groove 113 is disposed at a middle position of the substrate 10 and passes through the substrate 10. First pads 114 are disposed on the second surface 112, and the first pads 114 are located at positions on two opposite sides of the accommodation groove 113. The protrusion 155 is disposed at a middle position of a surface of the base 154. The inductive coil 153 includes a connection segment 156 extending from the protrusion 155. The inductive coil 153 is accommodated in the accommodation groove 113. The connection segment 156 extends from the accommodation groove 113, and is welded to the first pad 114, so that the inductive coil 153 is electrically connected to the substrate 10. It should be noted that when the substrate 10 is located on a horizontal plane, the first surface 111 is disposed upwards. The chip 12 is installed over the first surface 111, and the installation surface 120 is separated from and opposite to the first surface in, to ensure that there may be a gap between the chip 12 and the first surface. In addition, the installation surface 120 is right over the accommodation groove 113 and faces the accommodation groove, so that the protrusion 155 can be exactly projected on the installation surface 120, to facilitate heat dissipation of the magnetic core 151.

Referring to FIG. 1 and FIG. 2 again, the magnetic core 151 is formed by means of integration by using a magnetic particle, that is, the protrusion 155 and the base 154 are integrated into one body. In this embodiment, the inductive coil 153 is first installed on the substrate 10, then the inductive coil 153 is plastically packaged by using a magnetic particle, the base 154 and the protrusion 155 that covers the inductive coil 153 are formed, and the inductor 15 that includes the magnetic core 151 and the inductive coil 153 is further formed. The protrusion 155 fills the entire accommodation groove 113. It can be understood that alternatively, there may be a gap between the protrusion 155 and an inner side wall of the accommodation groove 113. According to the system in package module assembly described in the present invention, a partial structure of the inductor 15 is disposed in the substrate 10, so that space of the substrate 10 in a thickness direction is saved, and thickness of the system in package module assembly is further reduced.

Referring to FIG. 3 again, further, second pads 115 are disposed on the first surface 111, the chip 12 is welded to the second pad 115 by using a welding body 121, and there is a gap between the chip 12 and the first surface 111. Specifically, the welding body 121 is welded to the second pad 115 in advance, the chip 12 is a flip chip, and a surface that is of the chip 12 and faces the first surface 111 is fastened to the welding body 121 by means of reflow soldering. In this way, the welding body 121 supports the chip, so that there is a gap between the chip and the first surface 111, that is, there is a gap between the chip and the protrusion 155 in the accommodation groove 113. It can be understood that the welding body 121 may be formed on the chip 12 in advance, and is fastened to the substrate by means of welding.

A third pad 116 is further disposed at a lateral position of the second pads 115 on the first surface 111, and the third pad 116 is configured to be welded and fastened to the electrical element 17. In this embodiment, the electrical element 17 is a component such as a resistor or a capacitor. It can be understood that the electrical element 17 may also be connected to a conducting wire disposed in the substrate 10, to be electrically connected to the substrate 10. Alternatively, a pin is disposed on the electrical element 17, and a conducting hole is correspondingly disposed on the first surface 111 of the substrate 10, so that the pin is inserted into the conducting hole and is fastened by means of soldering or the like.

Figure 5:
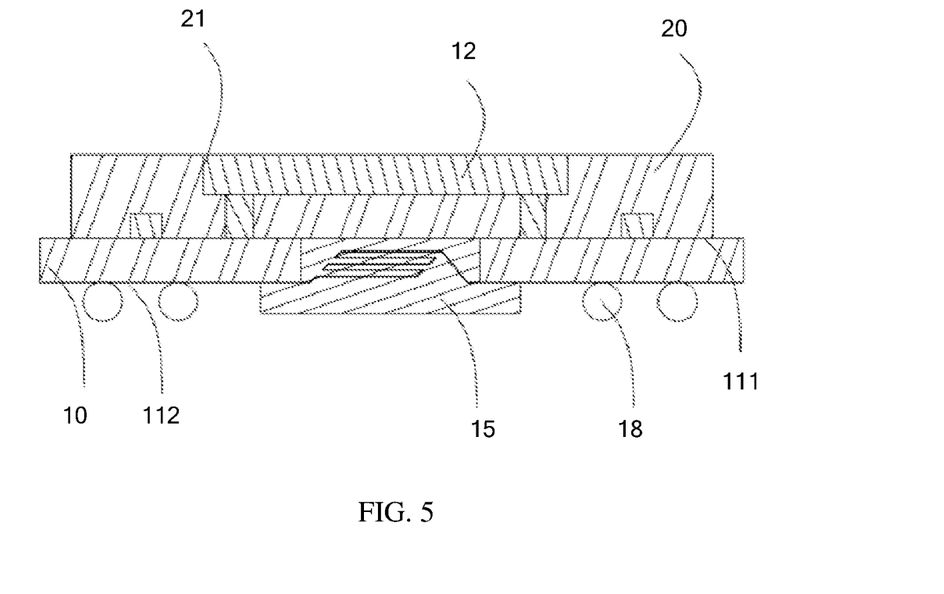
FIG. 5 is a schematic diagram of a cross section of a system in package module according to the present invention, where a cut position of the cross section is a center position of an inductor of the system in package module.

Referring to FIG. 5, the present invention provides a system in package module. The system in package module includes the system in package module assembly and a plastic package body 20. In this embodiment, the plastic package body 20 is formed on the first surface 111, and covers the first surface 111, the chip 12, the electrical element 17, and the accommodation groove 113. Specifically, the plastic package body 20 is formed on the first surface 111 of the substrate 10 by means of injection molding, totally envelops the chip 12, and seals the protrusion 155 in the accommodation groove 113. The plastic package body 20 can effectively prevent the chip 12 and the electrical element 17 from being damaged. Still further, a window 21 is disposed at a position that is on the plastic package body 20 and that is corresponding to the chip 12, and the window 21 is configured to expose the chip 12, to effectively dissipate heat of the chip 12. In this embodiment, the window 21 exposes the chip 12 on a side away from the substrate 10. After the plastic package body 20 is formed, a part that is of the plastic package body and is corresponding to the chip 12 is removed by means of grinding, so that the window 21 exposes the chip 12. In another implementation, the plastic package body 20 may be formed after a part that is of the chip and needs to be exposed is isolated by means of enveloping by using a film, so that the chip 12 is partially exposed.

A conducting ball 18 electrically connected to the substrate 10 is further disposed on the second surface 112, and a height of a part that is of the conducting ball 18 and protrudes from the second surface 112 is greater than thickness of the base 154 of the magnetic core 151. Specifically, multiple welding points 117 are further disposed on the second surface 112 around the base 154. The conducting ball 18 is installed at the welding point, and is formed by means of reflow soldering. The conducting ball 18 is configured to output a circuit signal of the substrate, and is welded to a circuit board of an electronic device, so that the substrate 10 and the circuit board of the electronic device are electrically conducted.

Figure 6:
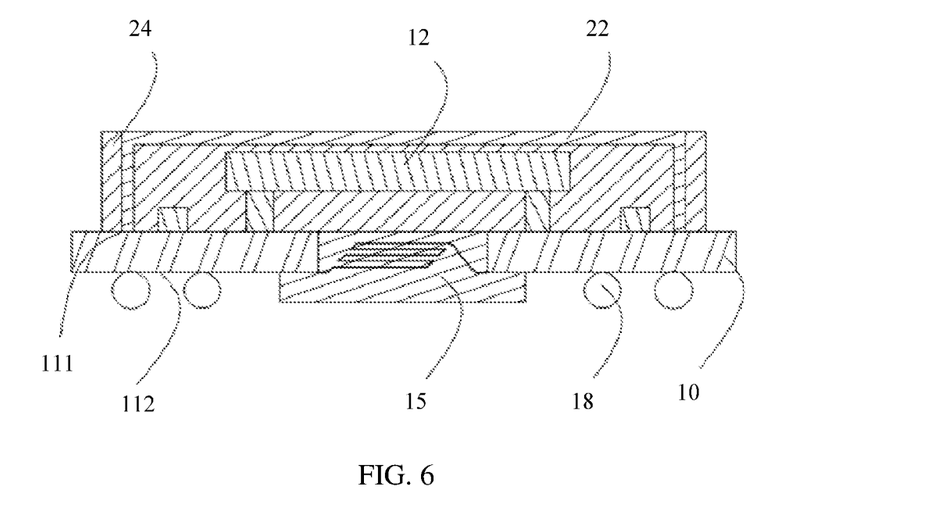
FIG. 6 is a schematic diagram of a cross section obtained when a heal dissipation cover is disposed in the system in package module shown in FIG. 5.
Figure 7:
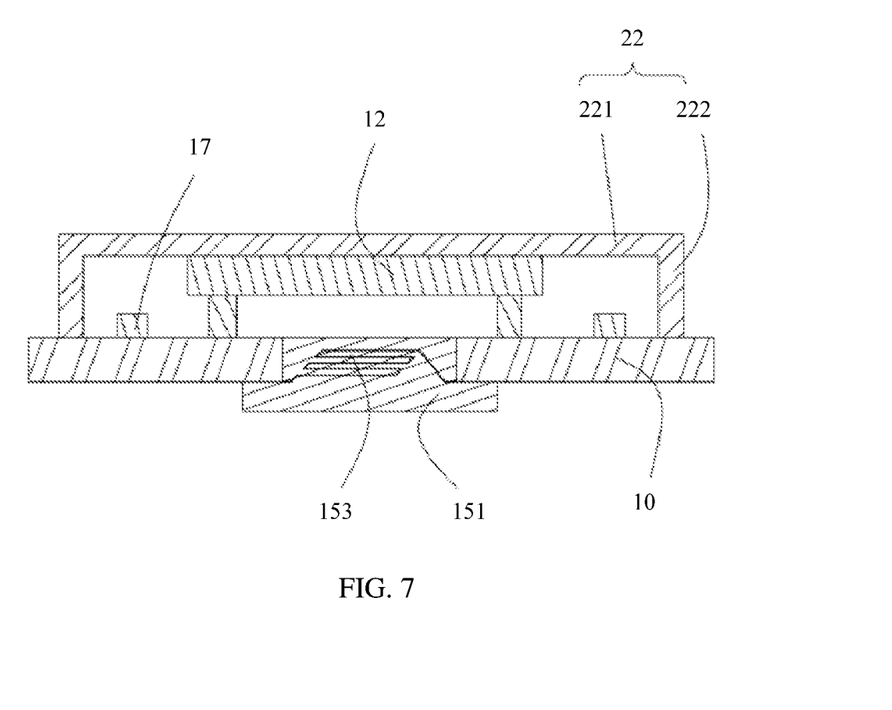
FIG. 7 is a schematic diagram of a cross section obtained when a plastic package body is removed from the system in package module shown in FIG. 6.

Referring to FIG. 6 and FIG. 7, in another implementation of the present invention, the system in package module further includes a heat dissipation cover 22. The heat dissipation cover 22 covers the first surface 111 and space is formed between the heat dissipation cover and the first surface. The chip 12 and the electrical element 17 are accommodated in the space. Specifically, the heat dissipation cover 22 includes a top wall 221 and a side wall 222 disposed on an edge of the top wall. The side wall 222 abuts on the first surface, and the top wall 221 is separated from and opposite to the first surface 111, so that the space is formed. The chip 12, the electrical element 17, and the protrusion 155 under the chip 12 are located in the space. The chip 12 is in contact with the top wall. The heat dissipation cover is configured to dissipate heat of the chip 12 and the electrical element.

In this embodiment, when the system in package module further includes the heat dissipation cover 22, the system in package module assembly further includes a plastic package body 24. The plastic package body 24 is formed on the first surface 111 by means of in-mold decoration, and covers the first surface 111, the heat dissipation cover 22, the chip 12, the electrical element 17, and the accommodation groove. Still further, a window is disposed on a surface that is of the plastic package body 24 and that is opposite to the second surface 112, and the window is configured to expose a part that is of the heat dissipation cover 22 and that is opposite to the first surface 111. Specifically, the plastic package body 24 is formed on the first surface 111 of the substrate 10 by means of injection molding, totally envelops the heat dissipation cover 22 and the chip 12, and seals the protrusion 155 in the accommodation groove 113. The plastic package body 24 can effectively prevent the heat dissipation cover 22, the chip 12, and the electrical element 17 from being damaged. The window (not shown in the figure) on the plastic package body 24 exactly faces the top wall 221 of the heat dissipation cover 22. Because the top wall 221 is opposite to the chip 12, the window is configured to expose the heat dissipation cover, so that the heat dissipation cover can dissipate heat more effectively, and further dissipate heat of the chip 12. In this embodiment, after the plastic package body 24 is formed, a part that is of the plastic package body and is corresponding to the chip 12 is removed by means of grinding, so that the window exposes the chip 12.

The present invention further includes an electronic device. The electronic device includes a circuit board and the system in package module. The second surface 112 of the substrate 10 faces the circuit board, and is welded and conducted to the circuit board. In this embodiment, the substrate 10 is welded and fastened to the circuit board by using a conducting ball, so that the substrate 10 and the circuit board are conducted. In another implementation, the substrate 10 and the circuit board may be conducted in another manner, for example, by using a conducting wire or a pad.

According to the system in package module assembly described in the present invention, the inductive coil 153 of the inductor 15 is disposed in the substrate 10, and the magnetic core is partially accommodated in the accommodation groove, so that space of the substrate 10 in a thickness direction is saved, and thickness of the system in package module assembly is reduced. Therefore, space of the electronic device in thickness is saved, and a purpose of thinning the electronic device is achieved.

What is disclosed above is only example embodiments of the present invention, and certainly is not intended to limit the protection scope of the present invention. Any equivalent modification made in accordance with the claims of the present invention shall fall within the scope of the present invention.

What is claimed is:

1. A system in package module assembly comprising:
a substrate;
a chip;
an inductor; and
an electrical element,
wherein that the chip, the inductor and the electrical element are electrically connected to the substrate;
wherein the substrate comprises a first surface, a second surface opposite to the first surface, and an accommodation groove;
wherein the accommodation groove passes through the second surface and the first surface;
wherein the inductor comprises a magnetic core and an inductive coil disposed in the magnetic core;
wherein the magnetic core comprises a base and a protrusion disposed on an outer surface of the base;
wherein the outer surface on which the protrusion is disposed and that is of the base abuts on the second surface;
wherein the protrusion is accommodated in the accommodation groove;
wherein the chip comprises an installation surface;
wherein the chip is installed over the first surface and the installation surface is separated from and opposite to the first surface,
wherein the protrusion in the accommodation groove is exactly projected on the installation surface of the chip; and
wherein the electrical element is located around the chip.

2. The system in package module assembly according to claim 1, wherein the inductive coil comprises a connection segment extending from the magnetic core, first pads are disposed on the second surface, and the connection segment is welded to one of the first pads.

3. The system in package module assembly according to claim 2, wherein second pads are disposed on the first surface, the chip is welded to the second pads by using a welding body, and there is a gap between the chip and the first surface.

4. The system in package module assembly according to claim 1,
wherein the inductive coil is disposed in the protrusion of the magnetic core; or one part of the inductive coil is disposed in the protrusion of the magnetic core, and the other part is disposed in the base of the magnetic core.

5. A system in package module comprising the system in package module assembly according to claim 1 and a plastic package body, wherein the plastic package body is formed on the first surface and covers the first surface, the chip, the electrical element, and the accommodation groove.

6. The system in package module according to claim 5, wherein a window is disposed at a position that is on the plastic package body and that is corresponding to the chip, and is configured to expose the chip.

7. The system in package module according to claim 5, further comprising a heat dissipation cover,
wherein the heat dissipation cover is disposed in the plastic package body and covers the first surface,
wherein a space is formed between the heat dissipation cover and the first surface, and
wherein the chip and the electrical element are accommodated in the space.

8. The system in package module according to claim 7, wherein a window is disposed on a surface that is of the plastic package body and that is opposite to the second surface, and the window is configured to expose a part that is of the heat dissipation cover and that is opposite to the first surface.

9. The system in package module according to claim 5, wherein a conducting ball electrically connected to the substrate is further disposed on the second surface, and a height of a part that is of the conducting ball and protrudes from the second surface is greater than thickness of the base of the magnetic core.

10. An electronic device, comprising a circuit board and the system in package module according to claim 5, wherein the second surface of the substrate faces the circuit board, and is welded and conducted to the circuit board.

* * * * *

UNITED STATES PATENT AND TRADEMARK OFFICE
CERTIFICATE OF CORRECTION

| | |
|---|---|
| PATENT NO. | : 11,133,128 B2 |
| APPLICATION NO. | : 16/022055 |
| DATED | : September 28, 2021 |
| INVENTOR(S) | : Gong et al. |

It is certified that error appears in the above-identified patent and that said Letters Patent is hereby corrected as shown below:

In the Claims

Claim 1: Column 7, Line 36: "the first surface," should read -- the first surface; --.

Signed and Sealed this
Fifth Day of July, 2022

*Katherine Kelly Vidal*

Katherine Kelly Vidal
*Director of the United States Patent and Trademark Office*